United States Patent
Vogel et al.

(10) Patent No.: US 11,781,245 B2
(45) Date of Patent: Oct. 10, 2023

(54) SILICON CARBIDE SUBSTRATE AND METHOD OF GROWING SIC SINGLE CRYSTAL BOULES

(71) Applicant: SICRYSTAL GMBH, Nuremberg (DE)

(72) Inventors: Michael Vogel, Nuremberg (DE); Bernhard Ecker, Nuremberg (DE); Ralf Müller, Zirndorf (DE); Matthias Stockmeier, Egloffstein (DE); Arnd-Dietrich Weber, Forchheim (DE)

(73) Assignee: SICRYSTAL GMBH, Nuremberg (DE)

( * ) Notice: Subject to any disclaimer, the term of this patent is extended or adjusted under 35 U.S.C. 154(b) by 139 days.

(21) Appl. No.: 17/544,868

(22) Filed: Dec. 7, 2021

(65) Prior Publication Data
US 2022/0090296 A1 Mar. 24, 2022

Related U.S. Application Data

(62) Division of application No. 16/492,044, filed as application No. PCT/EP2018/055597 on Mar. 7, 2018, now Pat. No. 11,236,438.

(30) Foreign Application Priority Data

Mar. 29, 2017 (EP) .................................... 17163519

(51) Int. Cl.
*C30B 29/36* (2006.01)
*C30B 23/00* (2006.01)

(52) U.S. Cl.
CPC .............. *C30B 29/36* (2013.01); *C30B 23/00* (2013.01)

(58) Field of Classification Search
CPC ......... H01L 21/02378; H01L 21/02447; H01L 21/02529; H01L 29/1608; H01L 29/0878; C30B 29/36; C30B 23/00
See application file for complete search history.

(56) References Cited

U.S. PATENT DOCUMENTS

| | | | | |
|---|---|---|---|---|
| 5,416,342 A | * | 5/1995 | Edmond | ................. H01L 33/34 257/E33.068 |
| 5,726,463 A | * | 3/1998 | Brown | .............. H01L 29/66068 257/77 |

(Continued)

FOREIGN PATENT DOCUMENTS

| CN | 102732953 A | 10/2012 |
|---|---|---|
| DE | 10 2005 049 932 A1 | 4/2007 |

(Continued)

OTHER PUBLICATIONS

Office action issued in corresponding Japanese Application No. 2019-551603 (including English translation), dispatched on Oct. 6, 2020, 16 pages.

(Continued)

*Primary Examiner* — Jaehwan Oh
(74) *Attorney, Agent, or Firm* — Lewis Roca Rothgerber Christie LLP

(57) ABSTRACT

The present invention relates to a silicon carbide (SiC) substrate with improved mechanical and electrical characteristics. Furthermore, the invention relates to a method for producing a bulk SiC crystal in a physical vapor transport growth system. The silicon carbide substrate comprises an inner region (102) which constitutes at least 30% of a total surface area of said substrate (100), a ring shaped peripheral region (104) radially surrounding the inner region (102), wherein a mean concentration of a dopant in the inner region (102) differs by at maximum $5 \cdot 10^{18}$ cm$^{-3}$, preferably $1 \cdot 10^{18}$ cm$^{-3}$, from the mean concentration of this dopant in the peripheral region (104).

6 Claims, 4 Drawing Sheets

(56) References Cited

U.S. PATENT DOCUMENTS

| | | | |
|---|---|---|---|
| 6,045,613 A | 4/2000 | Hunter | |
| 6,764,958 B1 * | 7/2004 | Nemani | H01L 21/02211 438/758 |
| 2012/0103249 A1 | 5/2012 | Gupta et al. | |
| 2013/0095294 A1 | 4/2013 | Sasaki et al. | |
| 2014/0220296 A1 * | 8/2014 | Loboda | C30B 29/36 117/109 |
| 2015/0072100 A1 * | 3/2015 | Genba | C30B 25/12 117/88 |
| 2019/0316273 A1 * | 10/2019 | Ishibashi | H01L 21/02579 |

FOREIGN PATENT DOCUMENTS

| | | |
|---|---|---|
| EP | 2 330 236 A1 | 6/2011 |
| JP | 2001-226199 | 8/2001 |
| JP | 2008-538542 | 10/2008 |
| JP | 2009-40637 A | 2/2009 |
| JP | 2011-251885 | 12/2011 |
| JP | 2016-056088 | 4/2016 |
| WO | WO 2006/113657 A1 | 10/2006 |
| WO | WO 2017/053883 A1 | 3/2017 |

OTHER PUBLICATIONS

Office action issued in corresponding Chinese Application No. 201880013241.6 (including English translation), dated Oct. 10, 2020, 14 pages.

Wellmann et al., Optical quantitative determination of doping levels and their distribution in SiC, Material Science and Engineering, NL, Elsevier, 2002, B91-92, p. 75-78.

International Search Report corresponding to PCT/EP2018/055597, dated Apr. 20, 2018 (3 pages).

European Search Report corresponding to EP 17 16 3519, dated Jul. 21, 2017 (7 pages).

* cited by examiner

SILICON CARBIDE SUBSTRATE AND METHOD OF GROWING SIC SINGLE CRYSTAL BOULES

CROSS-REFERENCE TO RELATED APPLICATION(S)

This application is a divisional of U.S. patent application Ser. No. 16/492,044, filed Sep. 6, 2019, which is a U.S. National Phase Patent Application of International Application Number PCT/EP2018/055597, filed Mar. 7, 2018, which claims priority to European Patent Application No. 17163519.6, filed Mar. 29, 2017, the entire contents of all of which are incorporated herein by reference.

The present invention relates to a silicon carbide (SiC) substrate with improved mechanical and electrical characteristics. Furthermore, the invention relates to a method for producing a bulk SiC crystal in a physical vapor transport growth system.

Due to its outstanding physical, chemical and electrical properties silicon carbide is used inter alia as a semiconductor substrate material for power electronics semiconductor components, for radio frequency components and for a variety of special light emitting semiconductor components. Bulk SiC crystals with ideally pure and defect-free quality are required as a basis for these products.

As this is known in the art, bulk SiC crystals are generally produced by means of physical vapor deposition techniques, in particular using a sublimation method. Temperatures of more than 2000° C. are required for this process. Physical vapor transport (PVT) is essentially a sublimation and re-condensation process, in which a source material and a seed crystal are placed inside a growth furnace in such a way that the temperature of the source material is higher than that of the seed, so that the source material sublimes and the vapor species diffuse and deposit onto the seed to form single crystals.

For producing wafer-shaped substrates, the bulk SiC crystals are sliced e. g. by means of diamond impregnated wire saws. The surface is refined by subsequent multistage polishing steps. For fabricating electronic components, thin monocrystalline layers (e. g. SiC or GaN) are epitaxially deposited on the polished substrates. The characteristics of these layers and consequently of the electronic components fabricated therefrom decisively depend on the quality of the underlying SiC substrate.

In particular, the absorption characteristics of the substrate and its distribution over the substrate surface represent an important factor for the quality of the deposited epitaxial layers. This is because an inhomogeneous absorption over the surface of the SiC substrate leads to temperature variations at the epitaxial growth surface even for an initially uniform heating energy distribution inside an epitaxial reactor. Consequently, in an epitaxial reactor with e. g. a working temperature of 1600° C. and predominantly radiation driven heat transfer, an optimal thermal coupling inside the epitaxial reactor which is decisive for homogeneous and high-quality layer growth can only be ensured for substrates that have uniform absorption characteristics.

Substrates having inhomogeneous absorption characteristics lead to lower quality epitaxial layers and lower yield of the epitaxial production process.

U.S. Pat. No. 8,747,982 B2 shows a conventional method for fabricating SiC single crystals by means of physical vapor transport. During this process, the growth plane is defined by isothermal lines of the temperature field. It is mandatory that the surface is curved in order to fabricate high-quality SiC single crystals with this method. However, the curved thermal fields are also responsible for the occurrence of different temperatures in the peripheral regions compared to the centre when considering a particular crystal length. This leads to different incorporation of impurity atoms in the center compared to the peripheral regions. The consequence is an inhomogeneous distribution of foreign atoms over the finalized SiC substrate which in turn leads to an inhomogeneous absorption because the absorption characteristics also depend from the kind and number of built in impurity atoms. On the other hand, if the curvature of the isotherms is reduced too much in order to reduce the lateral differences of the built in foreign atoms, low defect crystals can no longer be fabricated. In known fabrication processes the inhomogeneous absorption of the SiC substrates is often accepted together with the disadvantage of a lower yield for the epitaxial processes.

Furthermore, fabrication processes are known that employ rather high substrate thickness in order to ensure low values for bow and warp of the substrate. In U.S. Pat. No. 7,422,634 B2 it is mentioned that low bow and warp values can be achieved when choosing a substrate thickness of about 1 mm for substrates with a diameter of around 75 mm. Obviously, the enhanced thickness renders the substrate more stable by increasing its stiffness. Consequently, the substrate is less susceptible to a distortion due to inner mechanical tensions. This improved geometry is intended to ensure an optimal mechanical coupling inside the epitaxial reactor. However, this solution involves a higher amount of material and therefore significantly higher costs and, moreover, does not suffice in epitaxial systems at 1600° C. where the heat transfer by radiation predominates the transfer by heat conduction.

Published patent U.S. Pat. No. 8,747,982 B2 describes a method for producing SiC substrates with a defined position of the lattice planes. However, a good quality of the SiC substrate alone is not sufficient for depositing low-defect or defect free epitaxial layers thereon if the thermal coupling inside the epitaxial reactor is not homogeneous enough. Therefore, homogeneous absorption characteristics is needed additionally in order to achieve homogeneous heat coupling via heat radiation during the epitaxial process and thereby ensure low-defect or defect free epitaxial layers.

Consequently, there is still a need for an improved silicon carbide substrate and a fabrication method that ensures improved absorption characteristics of the substrate.

This object is solved by the subject matter of the independent claims. Advantageous embodiments of the present invention are the subject matter of the dependent claims.

The inventors of the present invention have recognized that the inhomogeneity of the absorption coefficient has to be limited in order to limit (or avoid) the above described negative impact on the epitaxial processes. As already mentioned above, the lateral differences in absorption in fully processed SiC substrates mainly depend on the thermal conditions during the growing process of the boule. In order to avoid crystal defects during the growth of the boule growth, the temperature field has to be chosen in a way that the isotherms are curved at the growth front (convex crystal). Consequently, for a chosen crystal length different temperatures are present in the center compared to the peripheral regions. This leads to differing build-in mechanisms for impurities because these mechanisms are temperature dependent. If the curvature of the isotherms is chosen to be too small, the crystals have too many defects.

Generally, it cannot be avoided that impurities, such as dopants or contaminants, are incorporated, which may comprise any chemical elements except silicon or carbon. On the one hand, nitrogen is usually needed as a dopant in order to adjust the electrical resistance of the substrate. On the other hand, source materials and crucible parts are always contaminated with traces of impurities, for instance iron, aluminum, or the like.

As this is known in the art, impurity atoms can replace silicon or carbon atoms at regular lattice sites, or they can be located at interstitial sites. Furthermore, the impurity atoms may be electrically active or inactive, according to their type and position within the crystal lattice. It has to be noted that measured electric characteristics, such as the electrical resistance, of the final product do not necessarily mirror the actual impurity atom concentration. These impurity atoms locally influence the absorption characteristic.

In particular, the absorption characteristics can be influenced by the presence of the dopant nitrogen due to nitrogen's impact on the so called donor-acceptor-pair (DAP) absorption band.

The lateral differences in absorption characteristics of the finally processed SiC substrates therefore depend from the built in foreign atoms, for instance nitrogen, during the growth of the crystal. The absorption characteristics of the SiC substrate have considerable influence on the quality of the coupling of the semi-transparent substrate to the thermal fields during the epitaxial process. Differences in the thermal coupling of the SiC substrate cause inhomogeneous temperature distribution across the substrate during the epitaxial growth. This causes disadvantageous and undesirable effects, in particular inhomogeneous growth of the epitaxial layers and therefore enhances costs and waste.

The present invention is based on the idea that negative impact on the epitaxial process can be avoided or at least reduced by limiting the inhomogeneous distribution of the absorption coefficient. In order to reach particularly homogeneous lateral absorption characteristics in the finally processed substrate, the present invention adjusts a mean concentration of foreign atoms in two different regions by using improved crystal growth processes. In particular, by introducing additional dopant atoms with a controlled lateral distribution, the differences in absorption characteristics across the substrate's overall surface which are caused by the curved the isotherms during the growth of the crystal can be compensated.

An SiC substrate according to the present invention comprises in a radial direction at least two different regions. By providing significantly different concentrations of a chosen impurity atom in the first region compared to the second region, the distribution of the absorption characteristics in the substrate can be selectively controlled. In particular, a silicon carbide substrate according to the present invention comprises an inner region which constitutes at least 30% of a total surface area of said substrate, and a ring shaped peripheral region radially surrounding the inner region. A mean concentration of a dopant in the inner region is by no more than $5 \cdot 10^{18}$ cm$^{-3}$ different than the mean concentration of this dopant in the peripheral region, and the mean absorption coefficients of the inner and peripheral region differ by less than 10 cm$^{-1}$.

The inventors have recognized that thereby a uniform distribution of the absorption characteristics can be provided across the surface of the substrate, leading to a homogeneous heat coupling in an epitaxial reaction chamber. This in turn leads to epitaxial layers with a much higher quality.

Preferably, the inner region forms 45%±15% of the total surface area of said substrate. It could be shown that this apportionment leads to the most satisfactory results. As already mentioned, the mean concentration in the inner region is at maximum $5 \cdot 10^{18}$ cm$^{-3}$ different from the mean concentration in the peripheral region, preferably the mean concentration in the inner region is at maximum $1 \cdot 10^{18}$ cm$^{-3}$ different than the mean concentration in the peripheral region (i.e. the inner region may have a higher or a lower mean concentration compared to the peripheral region). It has to be noted that this amount of concentration difference is independent from a total dopant concentration level present in the substrate.

Any impurity element can be used as the absorption coefficient is adjusted by the dopant according to the present invention. Advantageously, nitrogen may be used which is introduced into the fabrication process anyway for determining the electrical resistance of the SiC substrate.

In order to achieve particularly high quality epitaxial layers, the maximum deviation of the mean absorption coefficients of the inner and the peripheral region is less than 10 cm$^{-1}$, preferably less than 5 cm$^{-1}$. The present invention may advantageously be employed for substrates that have a polytype selected from a group comprising 4H, 6H, 15R, and 3C. In particular, a 4H polytype is preferred. SiC exists in many different polytypes, such as 4H, 6H, 3C and 15R, but 4H-SiC is the polytype of highest interest for high power and high temperature electronics. The distinction between different polytypes is given by the stacking sequence of Si—C bilayers along the c-axis.

Furthermore, the orientation of the substrate's surface may be 0° to 8° off-axis, preferably the substrate surface has a 4° off-orientation, instead of being nominally on-axis. This orientation has an impact on the epitaxial growth of subsequently deposited layers.

Advantageously, the substrate has an electrical resistivity in a range from 12 mΩ cm to 26 mΩ cm, preferably in the range of 18 mΩ cm to 22 mΩ, and/or an etch pit density of less than 50000 cm$^{-2}$. The etch pitch density (EPD) is a measure for the amount of defects and dislocations contained in the near-surface region of the substrate.

The present invention further relates to a method of growing at least one SiC single crystal boule in a physical vapor transport growth system, the method comprising the steps of:

arranging an SiC powder source material in a source material compartment, arranging at least one SiC seed crystal within a growth compartment, wherein said source material compartment is connected to said growth compartment for providing sublimated gaseous components to the growth compartment, applying an elevated temperature for generating the sublimated gaseous components that generate an SiC growth phase at the SiC seed crystal, so that an SiC volume single crystal boule is formed at the SiC seed crystal, wherein the growth compartment comprises a dopant source and/or a dopant sink for controlling a dopant concentration in a radial direction with reference to a longitudinal axis of the single crystal boule during the growth of the single crystal boule.

There are several possibilities to control the dopant concentration. Generally spoken, a radially peripheral region of the single crystal (with respect to the longitudinal axis) has to be provided with a higher dopant concentration than a central region. According to the present invention, the difference of the mean dopant concentration in the central region with respect to the concentration in the peripheral region may not be larger than $5 \cdot 10^{18}$ cm$^{-3}$, preferably not larger than $1 \cdot 10^{18}$ cm$^{-3}$. The growth temperature may amount to around 2200° C. while reaching a pressure in a range between 0.1 mbar and 100 mbar.

This concentration difference can be achieved either by arranging a source for the particular dopant element in the peripheral region of the growth compartment, so that e. g. the peripheral region receives a higher amount of dopant compared to the inner region. Alternatively, also a getter material for the selected dopant can be arranged in an inner region of the growth compartment so that it has most impact on the inner region of the growing crystal.

For instance, the dopant may comprise nitrogen and/or ammonia. In this case, the peripheral region of the growing boule can be flushed with nitrogen gas. In particular, two or more gas inlets may be arranged symmetrically around the peripheral region of the inside of the growth compartment, injecting nitrogen gas into the atmosphere inside the growth compartment. This solution has the advantage that the concentration of the dopant built in during the growth process can quite easily be modified and optimized.

The enhanced concentration of the dopant in a peripheral region of the growing crystal can also be achieved by providing a dopant enriched SiC powder source material in a region opposite to the peripheral region of the seed crystal, instead of filling in a homogenous SiC powder source material. This variant has the advantage that a dopant enriched powder may be handled much easier than additional gas inlets and fluidic process agents. The concentration of the doping element in the enriched SiC powder is at least $1 \cdot 10^{20}$ cm$^{-3}$, preferably $5 \cdot 10^{20}$ cm$^{-3}$. The concentration of the doping element in the lower doped source material is lower than $5 \cdot 10^{17}$ cm$^{-3}$, preferably lower than $1 \cdot 10^{17}$ cm$^{-3}$.

As already mentioned, one way of providing the required concentration difference is to supply an increased amount of dopant in the second region. The other way is to locally reduce the amount of dopant supplied to the first region. This can for instance be done by providing a getter material closer to the central region of the growing crystal than to the periphery. The required getter material of course depends on the specific dopant of which the concentration profile has to be shaped.

According to an advantageous embodiment of the present invention, a nitrogen getter is provided that comprises one or more nitrogen binding metals. Such metals may for instance be tantalum, tungsten, molybdenum, niobium, hafnium, and/or alloys or mixtures therefrom.

Nitrogen that is present in the central area of the growth region is partly bound to the metal and (usually irreversible) nitride bonds are produced. This means that the lateral nitrogen distribution adjacent to the growth front of the crystal is controlled in a way that in the central region less nitrogen is available for being incorporated into the growing crystal than in the peripheral region.

It is clear for a person skilled in the art, that also other getter materials can be used, depending on the particular dopant that has to be influenced in the spatial concentration of its inclusion into the single crystal.

The getter material may for instance be provided in the form of granular or powdery particles held in place by a porous wall, such as graphite. The getter particles may comprise tantalum, tungsten, hafnium, molybdenum, niobium, hafnium, and/or alloys or mixtures therefrom in case that nitrogen is to be gettered. Nitrogen passes through the porous graphite wall and is bound to the getter metal irreversibly. Hence, in a radial direction a nitrogen concentration profile is generated that has lower concentration values in the centre than in the peripheral region. Consequently, in a central region of the growing SiC single crystal there is less gaseous nitrogen available for being built into the growing crystal lattice.

According to an advantageous embodiment of the present invention, the concentration profile of the dopant in the growth compartment may be adjusted at the interface between the growth compartment and the source material compartment. In particular, the step of arranging the SiC powder source material in the source material compartment may comprise filling in a dopant (e. g. nitrogen) enriched SiC powder source material and covering a central region of an interface between the source material compartment and the growth compartment partly with a dopant (e. g. nitrogen) getter. The getter can be a metal such as tantalum, tungsten, niobium, molybdenum or hafnium as alloy or mixture embodied in a graphite capsule, having a bulk density of 1.0 to 2.0 g/cm$^{-3}$, preferably of 1.2 g/cm$^{-3}$ with a composition of getter particles in the range of 0.01 mm to 1 mm, preferably in the range of 0.05 mm to 0.5 mm.

Of course, also various combinations of the above embodiments are intended to be covered by the present invention.

As this is generally known in the art, PVT growth techniques suffer from the fact that the growth rate is rather slow with typically being in the range of some 100 µm/h. Thus, there is an additional need for a process to grow SiC crystals more rapidly with unimpaired characteristics. For solving this problem, the ideas according to the present invention may be applied to a symmetric PVT growth system for simultaneously growing more than one SiC single crystal boule by partitioning the inner chamber of the crucible into a central source material compartment and two symmetrically arranged growth compartments, each comprising at least one SiC seed crystal. The growth compartments are each separated from the source material compartment by a gas permeable porous barrier. By means of such a perfectly symmetric arrangement, a temperature profile can be generated which has the highest temperature in the center of the source material compartment and regions having an identical lower temperature at the site of the seed crystals. Such a PVT growth system is described in European patent EP 2 664 695 B1.

Such a method of growing two SiC single crystals simultaneously has the advantage that a much higher volume of production can be reached while still maintaining an unimpaired quality of the produced boules.

The accompanying drawings are incorporated into and form a part of the specification to illustrate several embodiments of the present invention. These drawings together with the description serve to explain the principles of the invention. The drawings are merely for the purpose of illustrating the preferred and alternative examples of how the invention can be made and used and are not to be construed as limiting the invention to only the illustrated and described embodiments. Furthermore, several aspects of the embodiments may form—individually or in different combinations—solutions according to the present invention. Further features and advantages will become apparent from the following more particular description of the various embodiments of the invention, as illustrated in the accompanying drawings, in which like references refer to like elements, and wherein:

Figure 1:
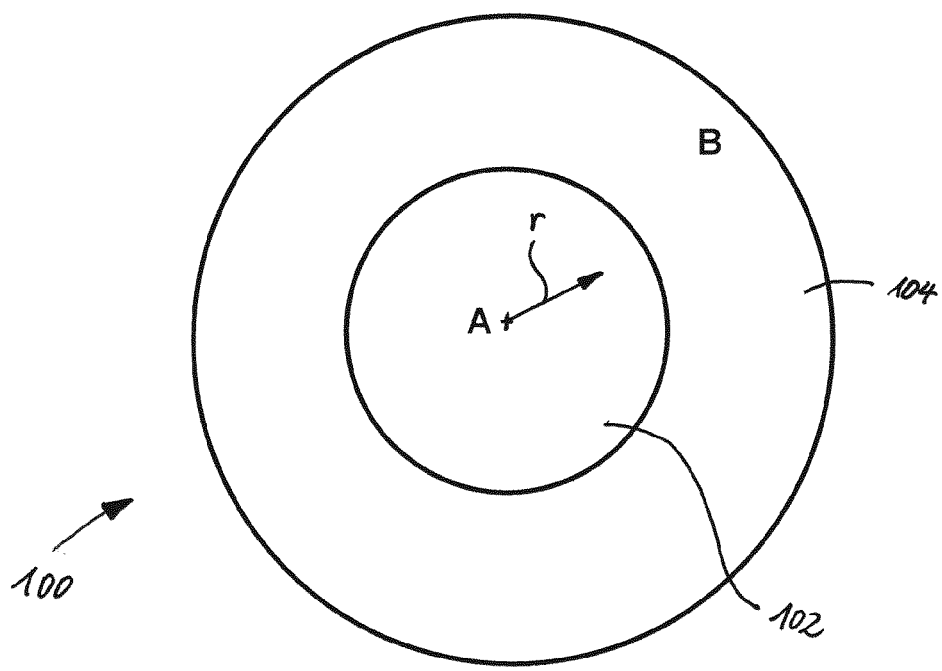
FIG. 1 shows a schematic top view of a silicon carbide substrate according to a first advantageous embodiment of the present invention.

The present invention will now be described in more detail with reference to the Figures. Turning first to FIG. 1, a schematic representation of a SiC substrate 100 (also sometimes called "wafer") according to the present invention is shown. According to the present invention, the SiC substrate 100 comprises in a radial direction (as indicated by the arrow r) a first region 102 and a second region 104. The first region 102 is surrounded by the second ring shaped region 104. As indicated by the letter "A", the first region 102 has a first mean concentration of a dopant such as nitrogen, whereas the second region 104 has a second mean concentration ("B") which is different from the first mean concentration. According to an exemplary embodiment of the present invention, the mean concentration of the dopant in the first region 102 is different than the mean concentration in the second region 104 by no more than $5 \cdot 10^{18}$ cm$^{-3}$, preferably by not more than $1 \cdot 10^{18}$ cm$^{-3}$. In particular, the mean concentration of nitrogen in the first region 102 may be lower than the nitrogen concentration in the second peripheral region 104.

According to an exemplary embodiment of the present invention, the mean absorption coefficient in the first region 102 is different from the mean absorption coefficient in the second region 104 by no more than 10 cm$^{-1}$, preferably by not more than 5 cm$^{-1}$. According to the present invention, the circular inner region 102 takes up at least 45%±15% of the total wafer surface. Accordingly, the ring shaped outer region 104 of course also takes up at least 45%±15% of the total wafer surface.

By introducing impurity atoms with different mean concentrations in the different first and second regions, the lateral absorption characteristics that were influenced by the thermal conditions during the growth of the boule can be homogenized. Therefore, the present invention provides an SiC substrate that ideally has completely homogeneous absorption characteristics, but at least has close to ideal homogeneous absorption characteristics. Inside an epitaxial reactor, these SiC substrates have the advantage that they have a homogeneous temperature profile at epitaxial growth conditions and allow the growth of high-quality epitaxial layers. Furthermore, high-quality electronic components can be fabricated on a substrate according to the present invention.

The SiC substrate 100 according to the present invention may be distinguished by the following features when providing a mean nitrogen dopant concentration which differs not more than $5 \cdot 10^{18}$ cm$^{-3}$ in the first (inner) region 102 from the mean dopant concentration in the second (outer) region 104, or preferably differs not more than $1 \cdot 10^{18}$ cm$^{-3}$ in the first (inner) region 102 from the dopant concentration in the second (outer) region 104.

The dimensions may be chosen so that the diameter is 100 mm or even 150 mm or 200 mm with a wafer thickness of less than 1000 μm and more than 200 μm, for example 350 μm±25 μm. The overall dislocation density as indicated by the etch pit density (EPD) may amount to 50 000 cm$^{-2}$, preferably stay below 10 000 cm$^{-2}$. The electrical resistivity may be in a range between 12 mΩ cm and 26 mΩ cm, preferably between 18 mΩ cm and 22 mΩ cm.

Depending on the intended subsequent epitaxial layers and on the required optical and semiconductor material properties, the SiC substrate may have one of the more than 200 possible SiC polytypes that have been found up to date. As this known in the art, the most common polytypes include 3C, 2H, 4H, 6H, 8H, 9R, 10H, 14H, 15R, 19R, 20H, 21H, and 24R, where (C), (H) and (R) are the three basic cubic, hexagonal and rhombohedral crystallographic categories. In the cubic zinc-blende structure, labelled as 3C-SiC or β-SiC, Si and C occupy ordered sites in a diamond framework. In hexagonal polytypes nH-SiC and rhombohedral polytypes nR-SiC, generally referred to as α-SiC, nSi-C bilayers consisting of C and Si layers stack in the primitive unit cell. Preferably, the substrate according to the present invention is of the 4H polytype. Moreover, the orientation of the substrate is between 0° and 8°, preferably 4° off-axis. Polytype and orientation is usually controlled by the orientation of the seed crystal or by tilting during the crystal preparation.

Figure 2:
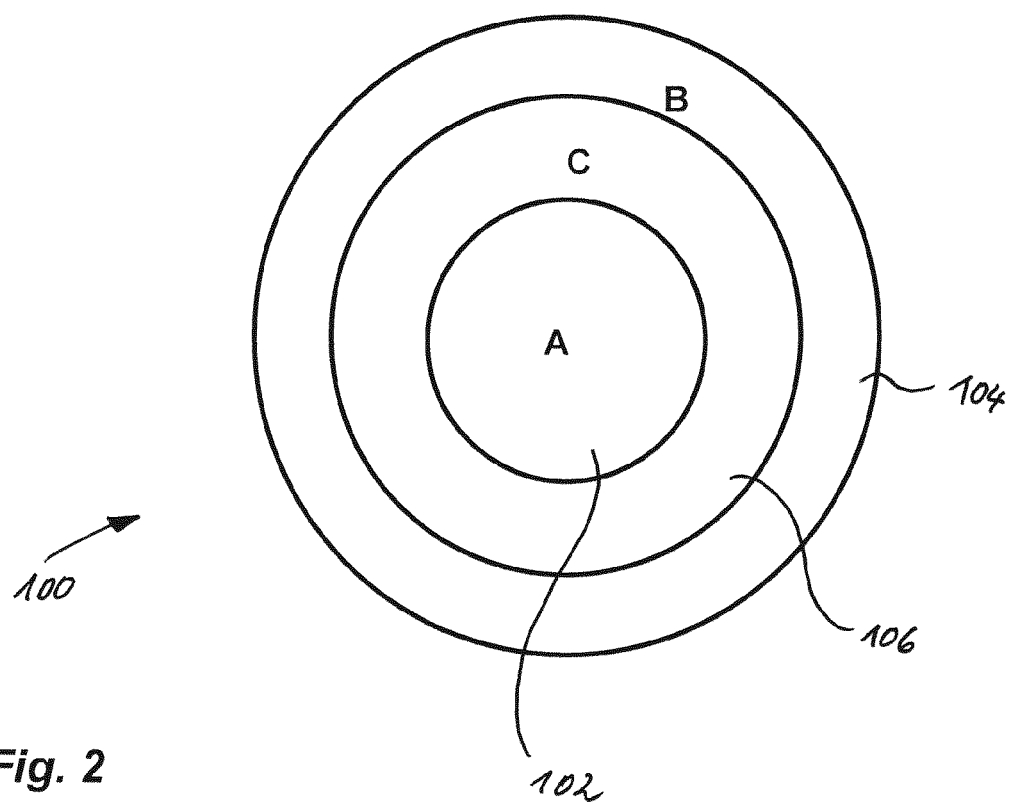
FIG. 2 shows a schematic top view of a silicon carbide substrate according to a second advantageous embodiment of the present invention.

FIG. 2 shows a further aspect of the substrate according to the present invention. When fabricating the SiC substrate in a PVT system, it can be expected that there will be no sharp delimiting line between the regions 102 and 104. Rather, there is a transitional region 106 having a gradient of the mean dopant concentration that lies between the values A and B of regions 102 and 104, respectively. The dopant concentration in the transitional region 106 is marked with the letter "C". It has to be understood, that in the transitional region 106 the mean dopant concentration is variable along the radial direction r to lead from the lower value A in the central region 102 to the higher value B in the peripheral region 104.

Importantly, it has to be noted that FIGS. 1 and 2 are schematic representations and are not to scale regarding the dimensions of regions 102, 104, and 106, and regarding the area ratios of these regions with respect to each other.

FIGS. 3 to 8 illustrate different embodiments of PVT processes for growing single crystal boules which can be sliced into substrates as described with reference to FIGS. 1 and 2.

Physical vapor transport (PVT), also known as seeded sublimation growth, has been the most popular and successful method to grow large sized SiC single crystals. U.S. Pat. No. 8,747,982 B2 describes an advantageous fabrication method that can be used and modified to fabricate SiC substrates according to the present invention.

A first example of generating a dopant profile in a radial direction during growth of an SiC single crystal 108 will be explained with reference to FIG. 3. In the following, the growing SiC single crystal 108 will also be referred to as "boule".

Figure 3:
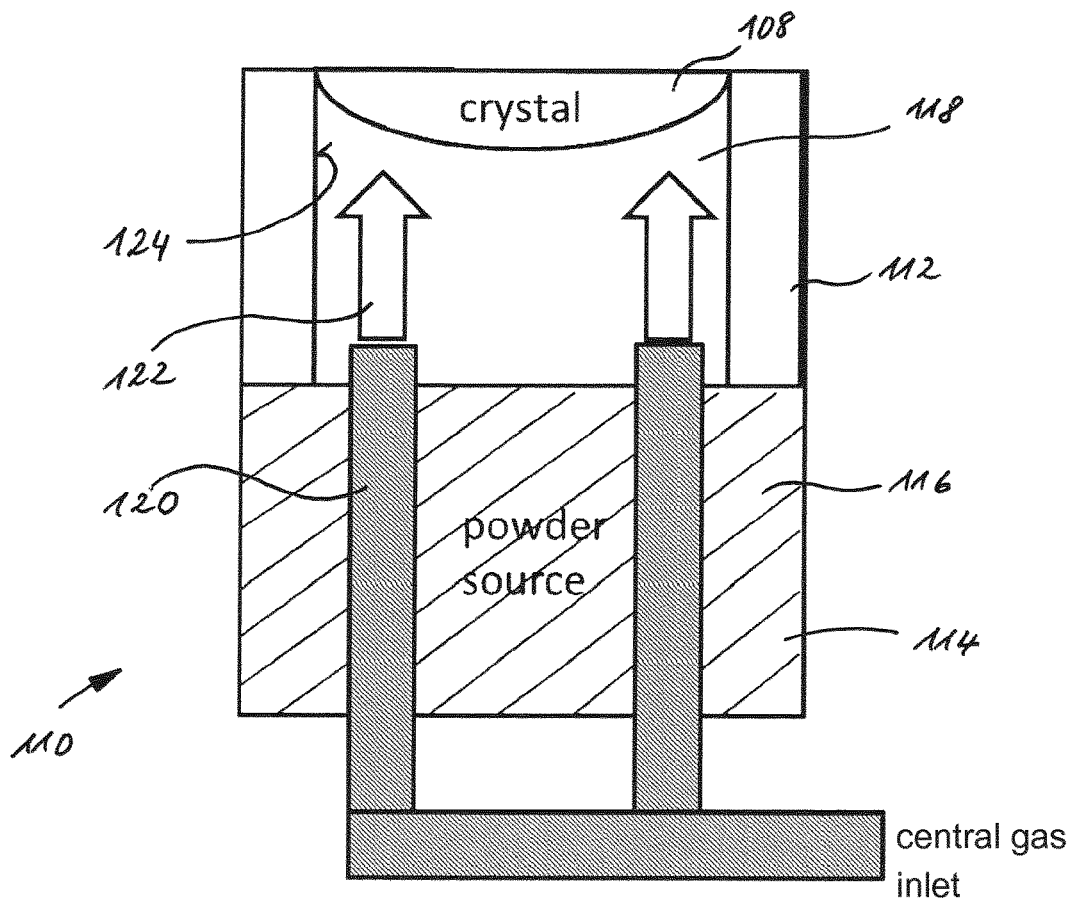
FIG. 3 shows a schematic cross sectional view of a PVT growth apparatus according to a first embodiment of the present invention.

FIG. 3 shows a schematic view of a PVT growth cell 110, wherein PVT growth of a SiC single crystal 108 is carried out in a graphite crucible 112 sealed with a graphite lid and loaded with a sublimation source 114 disposed in a source material compartment 116 at the bottom of the crucible 112. A single crystal seed (not visible in the Figures) is arranged at the crucible top. A thermal insulation material surrounds the crucible 112 and is only open in the region of a heat dissipation channel which generates the temperature gradient which is necessary for re-condensation (not shown in the Figures).

The sublimation source 114 is usually a polycrystalline SiC grain or powder synthesized in a separate process. The loaded crucible 112 is placed inside a growth chamber where it is surrounded by the thermal insulation (not shown in the Figures). Inductive or resistive heating (not shown in the Figures) is used to bring the crucible 112 to a suitable temperature, generally between 2000° C. and 2400° C. for the PVT growth of a SiC single crystal on the SiC single crystal seed. The growth chamber may for instance be made of fused silica, and an RF coil is positioned with respect to the crucible 112 such that during growth of the single crystal the temperature of the sublimation source 114 is maintained higher than the temperature of the seed crystal (typically with a difference of 10 to 200K).

Upon reaching a suitably high temperature, the sublimation source 114 vaporizes and fills a growth compartment 118 of the crucible 112 with a vapor of silicon, $Si_2C$ and $SiC_2$ molecules. The temperature difference between the sublimation source 114 and the seed crystal forces the vapor to migrate and to condense on the seed crystal, thereby forming a growing single crystal boule 108. In order to control the growth rate, PVT growth is typically carried out in the presence of a small pressure of inert gas, usually between 0.1 mbar and 100 mbar.

In addition to known arrangements as the ones shown in U.S. Pat. No. 8,747,982 B2, the present invention provides at least two, preferably six, gas inlets 120 which are arranged symmetrically at the periphery within the growth compartment 118. The gas inlets 120 provide a directed gas stream 122 that is directed towards a peripheral region of the growing crystal 108. Thereby, a dopant concentration difference occurs between those regions of the growth compartment 118 which are close to an inner wall 124 of the crucible 112 and the central region. By providing a higher dopant concentration close to the periphery of the growing crystal 108, a higher dopant concentration is built into the growing crystal lattice in the periphery compared to the concentration that is built in in the central region. Depending on the particular parameters of the gas streams 122, a concentration profile as shown in FIG. 1 or 2 can be realized for the finally processed SiC substrates that are produced from the crystal 108.

In the shown embodiment, the gas streams 122 contain nitrogen and/or ammonia as a dopant. However, of course, also other suitable gases can be introduced into the growth compartment 118 via the gas inlets 120.

As already mentioned above, the production times for growing SiC single crystals may be significantly reduced by simultaneously growing two crystals instead of one. In order to achieve such a simultaneous growth, the principles of European patent EP 2 664 695 B1 may be adapted to the ideas according to the present invention.

Figure 4:
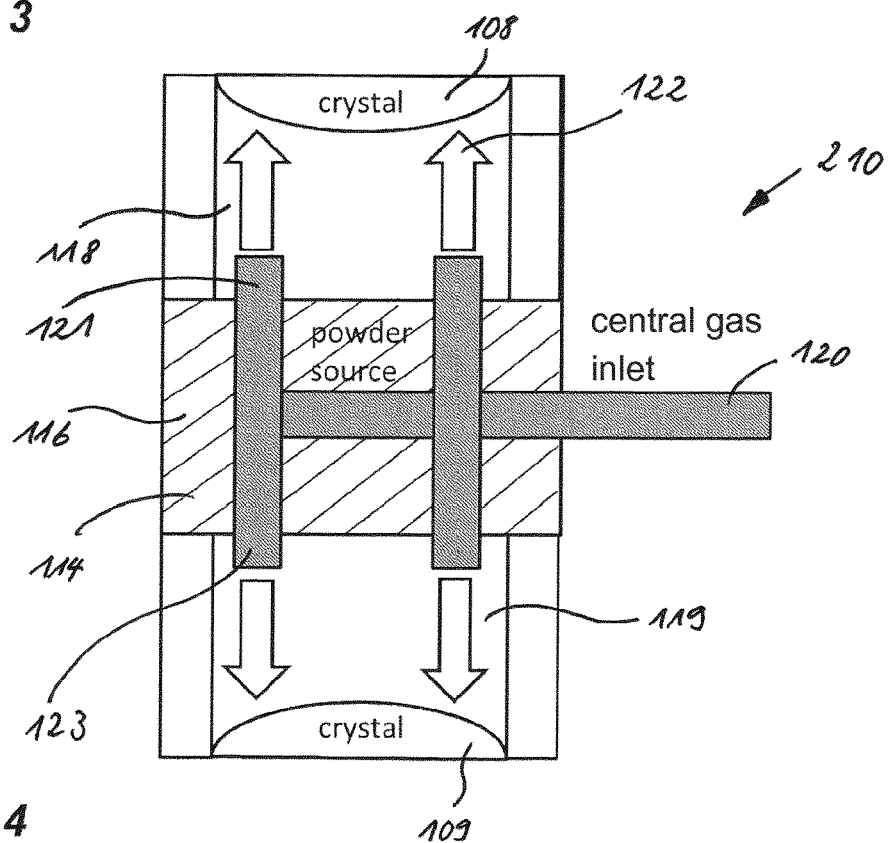
FIG. 4 shows a schematic cross sectional view of a PVT growth apparatus according to a further embodiment of the present invention.

As shown in FIG. 4, a growth cell 210 according to the present invention may comprise two growth compartments 118, 119. The growth compartments 118, 119 are arranged symmetrically with respect to a source material compartment 116 that comprises a sublimation source 114. In each of the growth compartments 118, 119 one crystal 108, 109 is growing from a seed crystal (not shown in the Figures).

Similar to the arrangement shown in FIG. 3, a gas inlet 120 is provided for introducing nitrogen gas towards each of the growing crystals 108, 109. Of course, any other gaseous dopant, e.g. ammonia, may also be covered by this embodiment.

In each of the growth compartments 118, 119 at least two, preferably six, symmetrically arranged dopant inlets 121, 123 are arranged in a way that the respective peripheral region of the growth compartments 118, 119 are supplied with a higher concentration of dopant than the central regions. This allows the production of SiC substrates having homogeneous absorption characteristics over the complete wafer surface.

Figure 5:
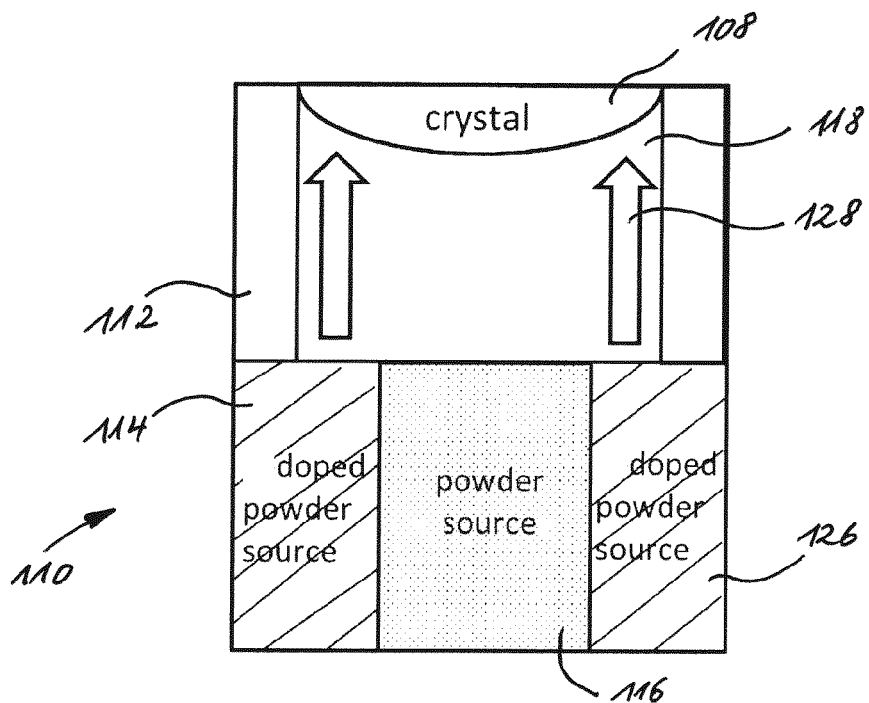
FIG. 5 shows a schematic cross sectional view of a PVT growth apparatus according to a further embodiment of the present invention.

FIG. 5 shows a further embodiment of a growth cell 110 for growing a single boule 108. The crystal 108 grows from a seed crystal arranged in a growth compartment 118. A sublimation powder source 114 is contained in a source material compartment 116. The bulk density of the source material should be in the range of 1.0 $g \cdot cm^{-3}$ to 2.6 $g \cdot cm^{-3}$, preferably in the range of 1.4 $g \cdot cm^{-3}$ to 1.8 $g \cdot cm^{-3}$. The grain size (D50) of the source material should be in the range of 100 µm to 1000 µm, preferably in the range of 300 µm to 500 µm. In contrast to known arrangements, however, the powder source 114 is not homogeneously distributed across the whole diameter of the crucible 112. According to the present invention, the periphery of the source material compartment 116 comprises an enriched source material 126 that is additionally enriched with a dopant, for instance nitrogen. The concentration of the doping element in the enriched SiC powder is at least $1 \cdot 10^{20}$ $cm^{-3}$, preferably $5 \cdot 10^{20}$ $cm^{-3}$. The concentration of the doping element in the lower doped source material is lower than $5 \cdot 10^{17}$ $cm^{-3}$, preferably lower than $1 \cdot 10^{17}$ $cm^{-3}$. During the heating process, a ring shaped stream 128 of the dopant is generated when vaporizing the enriched source material 126. Additionally, also a gradual dilution of the dopant can be provided at the interface between the undoped source material in the center and the enriched source material 126.

The advantage of this embodiment compared to the embodiment shown in FIG. 3 can be seen in the fact that firstly no gaseous dopant sources have to be handled and that, secondly, during the growth process no continuous access to the crucible 112 is required.

Figure 6:
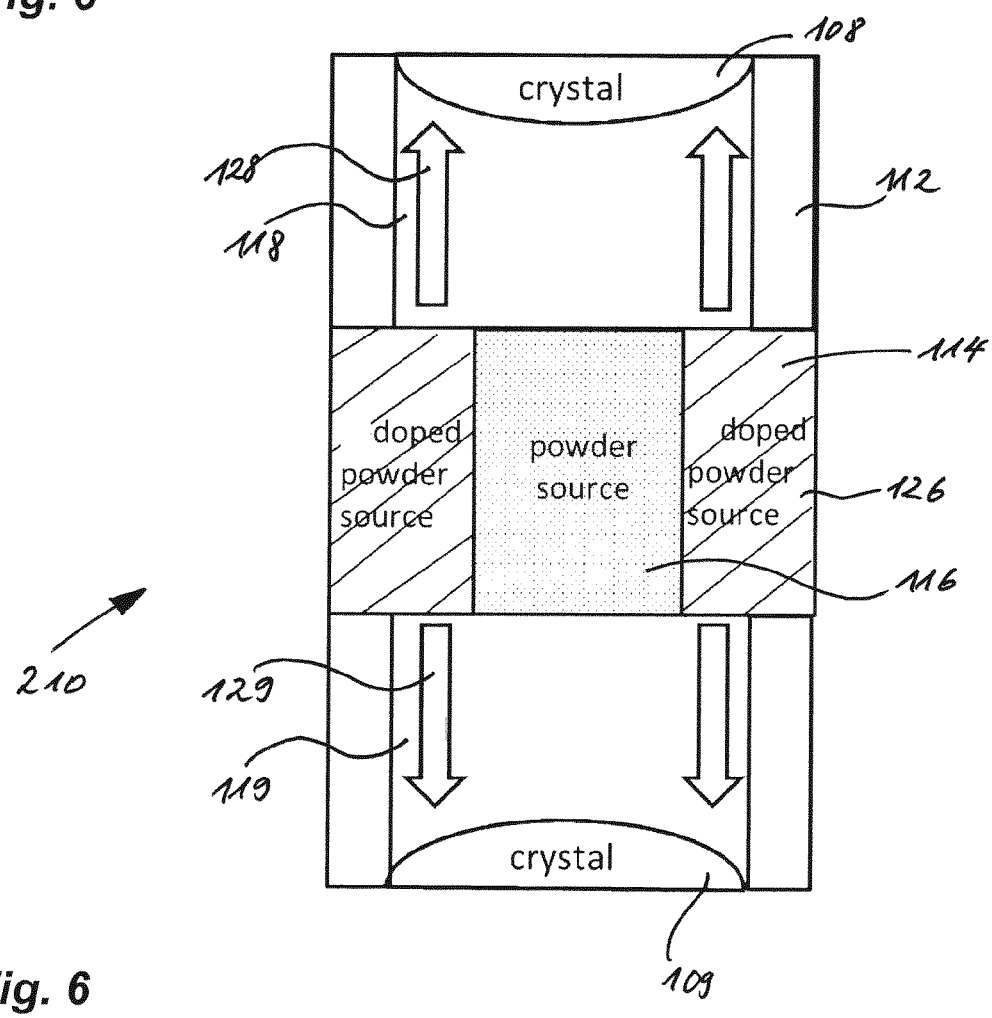
FIG. 6 shows a schematic cross sectional view of a PVT growth apparatus according to a further embodiment of the present invention.

The principle shown in FIG. 5 may of course also be applied to the idea of simultaneously growing two boules 108, 109. This growth cell arrangement 210 is depicted in FIG. 6. The growth cell 210 according to this embodiment comprises two growth compartments 118, 119. The growth compartments 118, 119 are arranged symmetrically with respect to a source material compartment 116 that comprises a sublimation source 114. In each of the growth compartments 118, 119 one crystal 108, 109 is growing from a seed crystal (not shown in the Figures).

Similar to the arrangement shown in FIG. 5, the powder source 114 is not homogeneously distributed across the whole diameter of the crucible 112. Rather, the periphery of the source material compartment 116 comprises an enriched source material 126 that is additionally enriched with a dopant, for instance nitrogen. During the heating process, two ring shaped streams 128, 129 of the dopant are generated when vaporizing the enriched source material 126 and are directed towards each of the growing crystals 108, 109. Additionally, also a gradual dilution of the dopant can be provided at the interface between the undoped source material in the center and the enriched source material 126. Of course, any other dopant may also be covered by this embodiment, although nitrogen is shown as an example.

Figure 7:
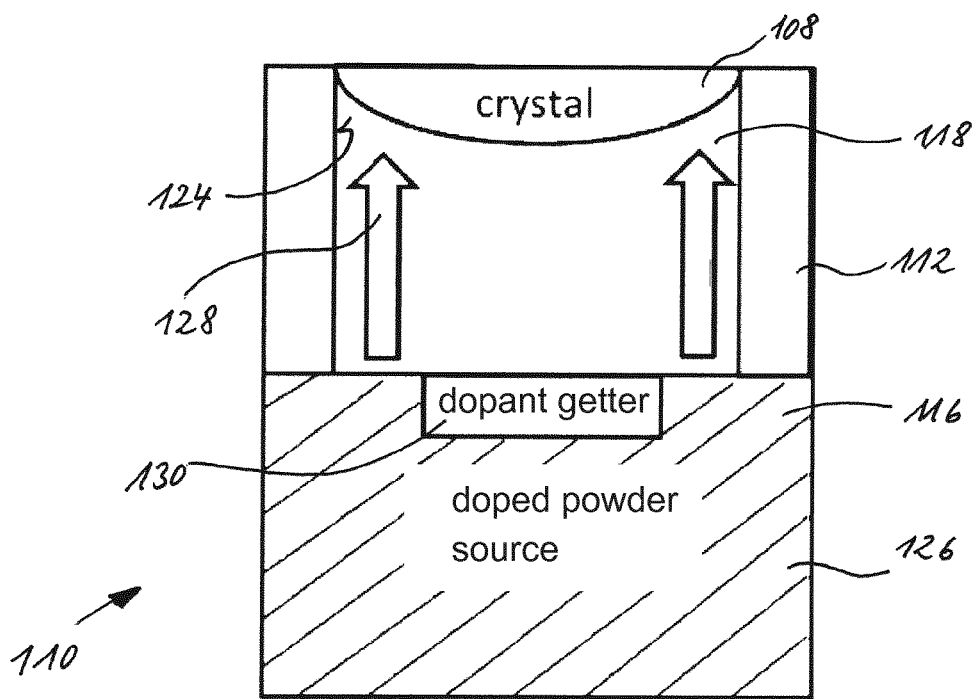
FIG. 7 shows a schematic cross sectional view of a PVT growth apparatus according to a further embodiment of the present invention.
Figure 8:
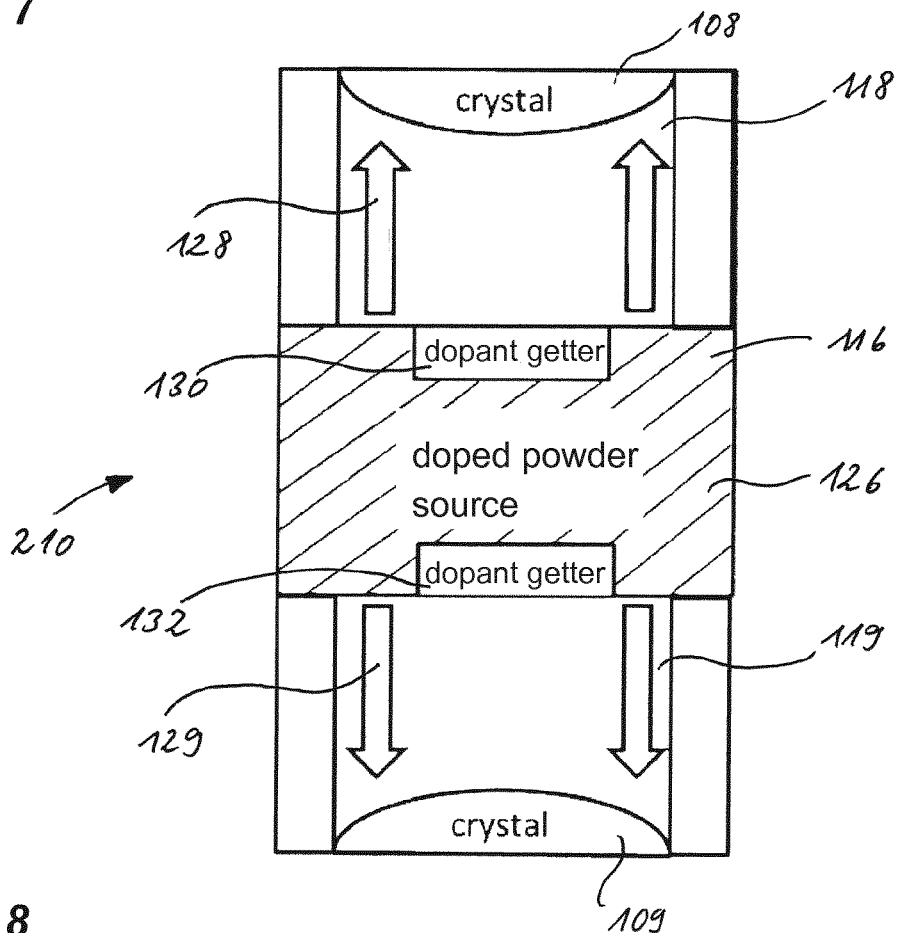
FIG. 8 shows a schematic cross sectional view of a PVT growth apparatus according to a further embodiment of the present invention.

FIGS. 3 to 6 as described above relate to the idea of actively enhancing the concentration of a dopant, such as nitrogen, in the periphery of the growth compartment 118. FIGS. 7 and 8 which will be described in the following, on the other hand, show embodiments where the concentration of the dopant is actively decreased in the central region of the growth compartment 118.

As shown in FIG. 7, the PVT growth cell 110 for growing a SiC single crystal 108 comprises a graphite crucible 112 sealed with a graphite lid and loaded with a dopant enriched sublimation source 126 disposed in a source material compartment 116 at the bottom of the crucible 112. A single crystal seed (not visible in the Figures) is arranged at the crucible top. A thermal insulation material surrounds the crucible 112 and is only open in the region of a heat dissipation channel which generates the temperature gradient which is necessary for re-condensation (not shown in the Figures).

The sublimation source 126 is for instance a polycrystalline SiC grain or powder synthesized in a separate process and doped with the desired dopant, such as nitrogen. The loaded crucible 112 is placed inside a growth chamber where it is surrounded by the thermal insulation (not shown in the Figures). Inductive or resistive heating (not shown in the Figures) is used to bring the crucible 112 to a suitable temperature, generally between 2000° C. and 2400° C. for the PVT growth of a SiC single crystal on the SiC single crystal seed. The growth chamber may for instance be made of fused silica, and an RF coil is positioned with respect to the crucible 112 such that during growth of the single crystal the temperature of the sublimation source 114 is maintained higher than the temperature of the seed crystal (typically with a difference of 10 to 200K).

Upon reaching a suitably high temperature, the nitrogen doped sublimation source 126 vaporizes and fills a growth compartment 118 of the crucible 112 with a vapor of silicon, $Si_2C$ and $SiC_2$ molecules. The temperature difference between the sublimation source 126 and the seed crystal forces the vapor to migrate and to condense on the seed crystal, thereby forming a growing single crystal boule 108.

According to the embodiment shown in FIG. 7, a nitrogen getter material 130 is arranged centrally at the interface between the nitrogen doped sublimation source 126 and the growth compartment 118. Thus, a ring shaped stream of dopant 128 (for example nitrogen) is generated that is directed towards the peripheral region of the growing crystal 118. In the central region, the getter material 130 binds a certain amount of the dopant atoms from the central region of the growth compartment 118. Therefore, the getter material 130 generates a concentration gradient of the dopant inside the growth compartments 118. In particular, the dopant concentration in the center of the growth compartments 118 is lower than in the peripheral region in order to lead to a lower dopant concentration being built into the growing crystal 108 in the central region.

Usually, a membrane of porous graphite is arranged between the source material compartment 116 and the growth compartment 118 (not shown in the Figures). This membrane separates the solid source material from the gaseous species. According to the present invention, a reservoir fabricated from a porous material is provided in the central region. The reservoir comprises e. g. graphite that allows a diffusion of the molecules and atoms from the growth compartment to the getter material and vice versa. Therefore, the reservoir walls should have a bulk density of 1.0 g·cm$^{-3}$ to 2.0 g·cm$^{-3}$, preferably of 1.2 g·cm$^{-3}$. The reservoir is filled with a granulated or powdery getter material, such as tantalum, tungsten, molybdenum, niobium, hafnium, and/or alloys or a mixture therefrom. The nitrogen that is passing through the getter material is irreversibly bound by the getter material 130. Hence, the lateral nitrogen distribution is influenced in a way that at the periphery more nitrogen is available for being built into the growing crystal than at the centre. In order to balance the getter functionality over the whole time of the crystal growth process, the composition of grain and powder sizes has to be adjusted in the range of 0.01 mm to 1 mm, preferably in the range of 0.05 mm to 0.5 mm, so that an optimized free surface of the getter is accessible. The height of the getter capsule has to be adjusted such that the getter capability is maintained throughout the crystal growth process, having a thickness of 1 mm to 20 mm, preferably 5 mm to 10 mm.

The idea of providing a centrally arranged getter material 130 may also be applied to an arrangement where two SiC boules 108, 109 grow simultaneously. This PVT growth cell 210 is depicted in FIG. 9. As shown in FIG. 9, a nitrogen doped powder source 126 is arranged between 2 growth compartments 118, 119. At the interface between the nitrogen doped powder source 126 and each of the growth compartments 118, 119, a nitrogen getter material 130, 132 is arranged centrally. Thus, ring shaped streams of dopant 128, 129 are generated which are directed towards the growing SiC crystals 108, 109. Accordingly, a higher dopant concentration is present in the peripheral regions of the growing crystals 108, 109.

Due to the reduced availability of the dopant in the central region of the growth compartments 118, 119 a lower dopant concentration is incorporated into the growing crystal 108 at the inner region compared to the peripheral region.

For instance, when using nitrogen as a dopant, the solid getter material 130, 132 may comprise a metal such as tantalum, tungsten, molybdenum, niobium or hafnium, and/or alloys or a mixture therefrom. These elements bind nitrogen irreversibly by forming nitride bonds. Other suitable getter materials may of course also be used.

A concentration profile of the finally processed SiC substrates according to the present invention as shown in FIGS. 1 and 2 can be achieved thereby. The concepts described above may of course also be combined as needed.

According to the present invention, the inhomogeneity of the absorption coefficient is limited in order to ensure a high quality of the layers grown on the SiC substrate by epitaxial processes. The absorption coefficient characterizes the reduction of the intensity of electromagnetic radiation when passing through a given material. The absorption coefficient has the dimension 1/length and is usually denoted with the unit 1/cm. A large absorption coefficient means that the specific material screens the particular radiation comparatively strongly, while a small absorption coefficient means that the material is more permeable for the particular radiation. Aside from other factors, the wavelength of the radiation strongly influences the absorption coefficient. For epitaxial processes the relevant wavelength is in a range between about 2 µm and 0.6 µm.

Silicon carbide is a semiconductor with a wide bandgap and the concentration of the charge carriers, and consequently also the dopant concentration strongly influences the absorption. The article P. J. Wellmann, R. Weingärtner, M. Bickermann, T. L. Straubinger, A. Winnacker: "Optical quantitative determination of doping levels and their distribution in SiC", Materials Science and Engineering B91-92 (2002) 75-78, illustrates in FIG. 1 the absorption spectra of n-type 4H-SiC material with low and high doping concentrations. As shown in this document, the higher the doping concentration (for instance nitrogen), the higher is the absorption coefficient.

Lateral differences of the absorption characteristics of a completely processed SiC substrate therefore depend on the manner in which dopants, e. g. nitrogen, are built into the lattice during crystal growth. The absorption characteristics of the SiC substrate significantly determine the quality of the coupling of the transparent wafer to the thermal field during any epitaxial process. Variations of the thermal coupling of the SiC substrate cause inhomogeneous temperatures during the epitaxial process and consequently lead to undesired effects, such as inhomogeneous growth of the epitaxial layers. Consequently, according to the present invention the inhomogeneity of the absorption coefficient is minimized for reducing the negative impact on the epitaxial layers.

| Reference Numerals: | |
|---|---|
| Reference Numeral | Description |
| 100 | SiC substrate |
| 102 | Inner region |
| 104 | Outer region |
| 106 | Transitional region |
| 108, 109 | SiC single crystal boule |
| 110, 210 | Growth cell |
| 112 | Crucible |
| 114 | Sublimation source material |
| 116 | Source material compartment |
| 118, 119 | Growth compartment |
| 120, 121, 123 | Gas inlet |
| 122 | Gas stream |
| 124 | Inner wall of crucible |
| 126 | Dopant enriched source material |
| 128, 129 | Stream of dopant |
| 130, 132 | Getter material |

The invention claimed is:

1. Method of growing at least one SiC single crystal boule (108, 109) in a physical vapor transport growth system, the method comprising the steps of:

arranging an SiC powder source material (114) in a source material compartment (116), arranging at least one SiC seed crystal within a growth compartment (118, 119), wherein said source material compartment (116) is connected to said growth compartment (118, 119) for providing sublimated gaseous components to the growth compartment (118, 119), applying an elevated temperature for generating the sublimated gaseous components that generate an SiC growth phase at the SiC seed crystal, so that an SiC volume single crystal boule (108, 109) is formed at the SiC seed crystal, wherein the at least one growth compartment (118, 119) comprises a dopant source and/or a dopant sink for controlling a dopant concentration in a radial direction with reference to a longitudinal axis of the single crystal boule (108, 109) during the growth of the single crystal boule.

2. Method according to claim 1, wherein said dopant comprises nitrogen.

3. Method according to claim 2, wherein a peripheral region of the growing boule (108, 109) is flushed with nitrogen and/or ammonia gas.

4. Method according to claim 1, wherein the SiC powder source material comprises a dopant enriched material (126) in a region opposite to a peripheral region of the seed crystal.

5. Method according to claim 1, wherein the step of arranging the SiC powder source material in the source material compartment comprises filling in a dopant enriched SiC powder source material (126) and covering a central region of an interface between the source material compartment (116) and the growth compartment (118, 119) with a getter material.

6. Method according to claim 1, wherein at least one SiC seed crystal is arranged within each of two growth compartments (118, 119), wherein said source material compartment (116) is arranged symmetrically between the two growth compartments (118, 119) and is separated from each of the growth compartments by a gas permeable porous membrane.

* * * * *